United States Patent
Chiu et al.

(10) Patent No.: US 10,068,842 B2
(45) Date of Patent: Sep. 4, 2018

(54) SINGLE-LAYER WIRING PACKAGE SUBSTRATE, SINGLE-LAYER WIRING PACKAGE STRUCTURE HAVING THE PACKAGE SUBSTRATE, AND METHOD OF FABRICATING THE SAME

(71) Applicant: Siliconware Precision Industries Co., Ltd., Taichung (TW)

(72) Inventors: Shih-Chao Chiu, Taichung (TW); Chun-Hsien Lin, Taichung (TW); Yu-Cheng Pai, Taichung (TW); Wei-Chung Hsiao, Taichung (TW); Ming-Chen Sun, Taichung (TW); Tzu-Chieh Shen, Taichung (TW); Chia-Cheng Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/648,089

(22) Filed: Jul. 12, 2017

(65) Prior Publication Data

US 2017/0309537 A1  Oct. 26, 2017

Related U.S. Application Data

(62) Division of application No. 14/876,404, filed on Oct. 6, 2015, now Pat. No. 9,735,080.

(30) Foreign Application Priority Data

Dec. 4, 2014 (TW) .............................. 103142114 A

(51) Int. Cl.
*H01L 23/498* (2006.01)
*H01L 21/48* (2006.01)
*H01L 23/31* (2006.01)

(52) U.S. Cl.
CPC .... *H01L 23/49861* (2013.01); *H01L 21/4846* (2013.01); *H01L 23/3128* (2013.01); *H01L 23/49811* (2013.01); *H01L 23/49827* (2013.01); *H01L 2224/73204* (2013.01); *H01L 2224/92125* (2013.01); *H01L 2924/181* (2013.01)

(58) Field of Classification Search
CPC ........... H01L 23/3178; H01L 23/49811; H01L 23/49816; H01L 23/49827
See application file for complete search history.

(56) References Cited

U.S. PATENT DOCUMENTS 6,265,782 B1 * 7/2001 Yamamoto ............. C09J 163/00
257/782

\* cited by examiner

*Primary Examiner* — Daniel Shook
(74) *Attorney, Agent, or Firm* — Mintz Levin Cohn Ferris Glovsky and Popeo, P.C.; Peter F. Corless; Steven M. Jensen

(57) ABSTRACT

A single-layer wiring package substrate and a method of fabricating the same are provided, the method including: forming on a carrier a wiring layer having a first surface and a second surface opposing the first surface and being in contact with the carrier; forming on the carrier and on the wiring layer a dielectric body that has a first side having a first opening, from which a portion of the wiring layer is exposed, and a second side opposing the first side and disposed at the same side as the second surface of the wiring layer; and removing the carrier, with the second side of the dielectric body and the second surface of the wiring layer exposed. Therefore, a coreless package substrate is fabricated, and the overall thickness and cost of the substrate are reduced.

13 Claims, 4 Drawing Sheets

SINGLE-LAYER WIRING PACKAGE SUBSTRATE, SINGLE-LAYER WIRING PACKAGE STRUCTURE HAVING THE PACKAGE SUBSTRATE, AND METHOD OF FABRICATING THE SAME

CROSS-REFERENCE TO RELATED APPLICATIONS

This application is a divisional of copending application U.S. Ser. No. 14/876,404, filed on Oct. 6, 2015, which claims under 35 U.S.C. § 119(a) the benefit of Taiwanese Application No. 103142114, filed Dec. 4, 2014, the entire contents of which are incorporated herein by reference.

BACKGROUND OF THE INVENTION

1. Field of the Invention

The present invention relates to a package substrate, a package structure having the package substrate, and a method of fabricating the same, and, more particularly, to a package substrate without a core layer, and a package structure having the package substrate.

2. Description of Related Art

With the rapid growth in the electronic industry, high-end electronic products have been developed to have a compact size and a low profile, and to be highly integrated. As the packaging technology advances, an increasing number of different types of chip packaging technologies have been developed, and the size of the semiconductor package is continuously decreasing, in order to achieve the low-profile requirement for the semiconductor package.

A typical packaging substrate structure is formed by stacking copper layers and insulating layers. FIG. 1 is a cross-sectional view showing a conventional package structure.

The conventional package structure comprises: a core layer 10; a first wiring layer 11 and a second wiring layer 13 formed on the core layer 10; conductive vias 15 penetrating the core layer 10 for electrically connecting the first wiring layer 11 and the second wiring layer 13; a first insulating layer 12 and a second insulating layer 14 formed on the first wiring layer 11 and the second wiring layer 13, respectively, with a portion of the first wiring layer 11 and the second wiring layer 13 exposed; and a semiconductor component 31 having bonding pads 310 for electrically connecting with the first wiring layer 11.

However, a package substrate 1 (which comprises a first wiring layer 11, a first insulating layer 12, a second wiring layer 13, a second insulating layer 14, and conductive vias 15) used in the conventional package structure typically has at least two wiring layers that are electrically connected to each other via the conductive vias 15.

However, the conductive vias 15 are fabricated through a mechanical drilling or a laser drilling process to form through holes penetrating the core layer 10, followed by an electroplating process to form an electroplated copper layer in the through holes. This undesirably increases the complexity of the fabricating processes.

In addition, the package substrate 1 used in the conventional package structure has a core layer. After the conductive vias in the core layer are formed, a buildup wiring layer is formed on the top and bottom surfaces of the core layer. Generally speaking, the core layer has at least two wiring layers. Since the substrate thickness cannot be reduced, it is difficult to reduce the overall thickness of the package structure.

Accordingly, with the increased demands for miniaturization of the electronic products as well as the low-profile substrate, there is an urgent need for reducing the substrate thickness such that the overall thickness of the package structure is reduced.

SUMMARY OF THE INVENTION

In view of the foraging drawbacks of the prior art, the present invention provides a method of fabricating a package substrate, comprising: forming a wiring layer having opposing first and second surfaces on a carrier, wherein the second surface of the wiring layer is in contact with the carrier; forming on the carrier a dielectric body that has a first side having a first opening, from which a portion of the wiring layer is exposed, and a second side opposing the first side and disposed at the same side as the second surface of the wiring layer; and removing the carrier with the second side of the dielectric body and the second surface of the wiring layer exposed.

The present invention further provides a package substrate, comprising: a wiring layer having opposing first and second surfaces; and a dielectric body having a first side having a first opening, from which a portion of the wiring layer is exposed, and a second side opposing the first side and disposed at the same side as the second surface of the wiring layer.

In an embodiment, the second side of the dielectric body is coplanar with the second surface of the wiring layer.

The present invention further provides a method of fabricating a package structure, comprising: providing a dielectric body having a first side with a first opening, a second side opposing the first side, and a single wiring layer embedded in the dielectric body and having a first surface and a second surface opposing the first surface, wherein the second surface of the single wiring layer is disposed at the same side as the second side of the dielectric body, with a portion of the wiring layer exposed from the first opening; and disposing on the second side of the dielectric body a semiconductor component electrically connected with the second surface of the wiring layer.

The present invention further provides a package structure, comprising: the above-mentioned single-layer wiring package substrate; and a semiconductor component disposed on the second side of the dielectric body and electrically connected with the second surface of the wiring layer.

In an embodiment, the second side of the dielectric body is coplanar with the second surface of the wiring layer.

In an embodiment, the first opening of the dielectric body is formed by an exposure and development process.

In an embodiment, when the first opening is formed, a second opening that corresponds in position to the first opening is further formed on the first surface of the wiring layer. In the aforementioned embodiment of a package substrate, the second opening is formed on the first surface of the wiring layer and corresponds in position to the first opening. In the embodiment of a package structure and the fabricating method thereof, the second opening is formed on the first surface of the wiring layer and corresponds in position to the first opening.

In an embodiment, the dielectric body is made of a photosensitive dielectric material.

In an embodiment, the semiconductor component has a plurality of conductive bumps that are electrically connected to the second surface of the wiring layer.

In an embodiment, an encapsulant is further formed on the dielectric body after the semiconductor component is disposed, such that the semiconductor component is encapsulated within the encapsulant. In an embodiment, an encapsulant is formed on the dielectric body such that the semiconductor component is encapsulated within the encapsulant.

In an embodiment, an underfill is further filled between the semiconductor component and the second side of the dielectric body. In the aforementioned embodiment of a package structure, the package structure further comprises an underfill filled between the semiconductor component and the second side of the dielectric body.

In an embodiment, a seed layer is further formed on the carrier. In another embodiment, a seed layer is further formed on the second surface of the wiring layer. In yet another embodiment, the seed layer is removed using an etching process, and a second opening is formed on the first surface of the wiring layer at the position corresponding to the first opening.

In summary, the package substrate according to the present invention is characterized by having a single-layer wiring layer and through electrically connecting the first and second surfaces of the wiring layer with the semiconductor component and other external components subsequently mounted to achieve the objective of using only a single-layer wiring layer to electrically connect the semiconductor component and external components.

In addition, a package substrate according to the present invention does not have a core layer, and the overall thickness of the package substrate is reduced which could be used in an electronic device of a smaller size.

Moreover, the present invention has an advantage of being free of forming through holes on the substrate for serving as a conductive pathway by a subsequent electroplating process, and therefore is capable of simplifying the fabricating process. In addition, when a photosensitive material which has both the photo resist and packaging properties is used to form the dielectric body, it is not required to use an additional photo resist agent, thereby simplifying the fabricating process.

In addition, when a photosensitive material is used to form the dielectric body of the present invention, the photosensitive dielectric material is patterned to fabricate the wiring layer, vias or the opening of the dielectric body, such that it is possible to meet the requirement to fine traces and increase the wiring density without the need of using a mechanical drilling or a laser drilling.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modifications and variations can be made without departing from the spirit of the present invention. Further, terms such as "top," "first," "second," and "side" are merely for an illustrative purpose and should not be construed to limit the scope of the present invention.

FIGS. 2A-2D are schematic views showing a method of fabricating a package substrate according to the present invention.

Figure 1:
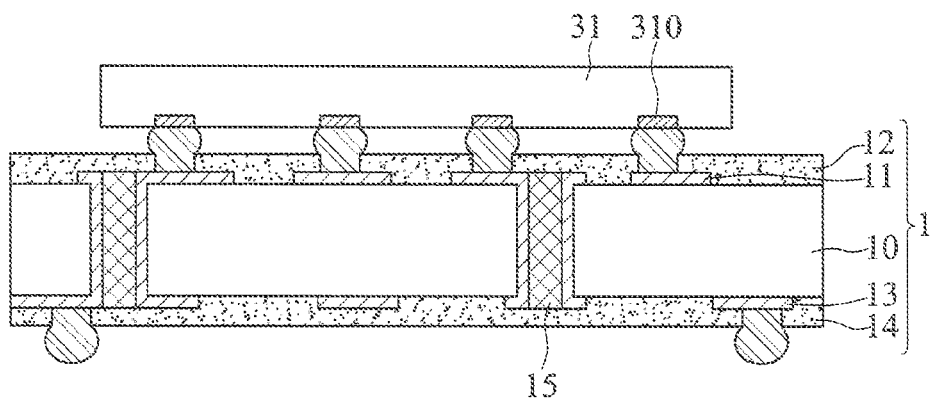
FIG. 1 is a cross-sectional view of a conventional package structure.
Figure 2A:
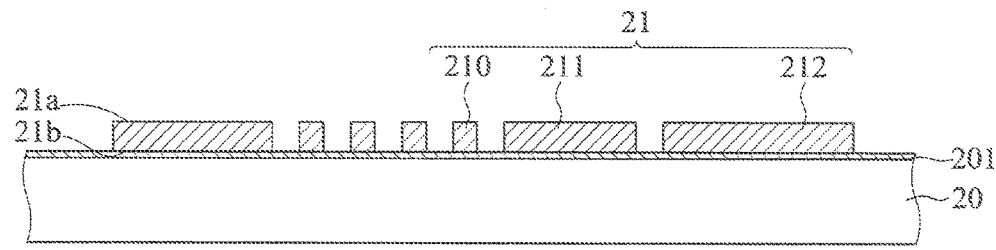
FIGS. 2A-2D are schematic views showing a method of fabricating a package substrate according to the present invention.

As shown in FIG. 2A, a wiring layer 21 having a first surface 21a and an opposing second surface 21b is formed on a carrier 20.

In an embodiment, the wiring layer 21 is defined to have a plurality of electrical connection regions 210, electrode regions 212 and wiring regions 211. The wiring layer 21 is made of copper. In an embodiment, the carrier 20 further comprises a seed layer 201 formed thereon.

In an embodiment, the carrier 20 is formed of any material, as long as the material can be easily removed. A typical patterning method is employed to dispose and form the wiring layer 21.

Figure 2B:
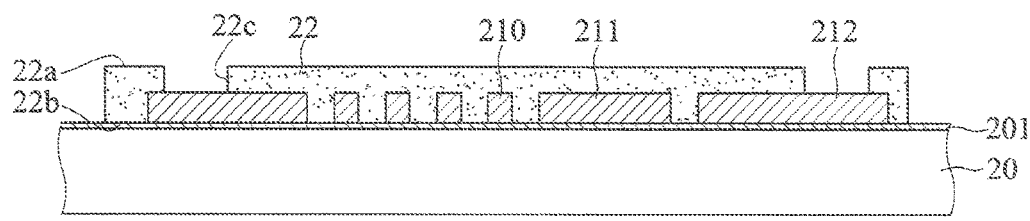

As shown in FIG. 2B, a dielectric body 22 is formed on the carrier 20 and the wiring layer 21, and has a first side 22a and an opposing second side 22b on the same side as the second surface 21b of the wiring layer 21. The first side 22a of the dielectric body 22 has a first opening 22c, from which a portion of the wiring layer 21 is exposed.

In an embodiment, a dielectric body 22 is firstly formed, and then a mechanical drilling or a laser drilling is employed to form the first opening 22c on the first side 22a of the dielectric body 22. In an embodiment, the first opening 22c exposes the first surface 21a of the electrode regions 212 of the wiring layer 21. In another embodiment, the dielectric body 22 is made of a molding compound or a prepreg.

In an embodiment, the dielectric body 22 is made of a photosensitive dielectric material (e.g., a photo-imageable dielectric, PID), and the first opening 22c is formed by an exposure and development process to expose a portion of the first surface 21a of the wiring layer 21.

In an embodiment, the photosensitive dielectric material is not limited to any kind. It is applicable to use either a photosensitive dielectric material or a negative-type photosensitive dielectric material, according to the types of the fabricating process. Taking the negative-type photosensitive dielectric material as an example, the photosensitive dielectric material is formed on the carrier 20, and a mask is formed to cover the location where the first opening 22c is to be formed. Through an exposure and curing process (usually referring to the UV curing), the photosensitive dielectric material that has not been exposed and cured, is removed, so as to obtain the dielectric body 22 having the first opening 22c. In an embodiment, the method of removing the photosensitive dielectric material that has not been exposed and cured is not limited to any kind, and a typical photoresist agent is employed for this process.

Figure 2C:
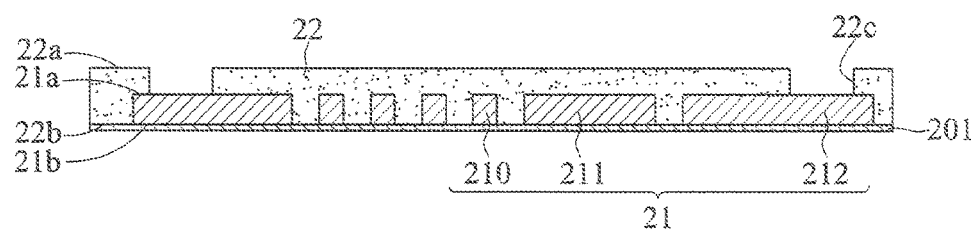

As shown in FIG. 2C, the carrier 20 is removed to expose the seed layer 201.

In an embodiment, the wiring layer 21 is firstly formed on the carrier 20 (as shown in FIG. 2B), followed by formation of the dielectric body 22 on the carrier 20 for covering the wiring layer 21, such that the second side 22b of the dielectric body 22 is coplanar with the second surface 21b of the wiring layer 21. In other words, the second side 22b of the dielectric body 22 is flush with the second surface 21b of the wiring layer 21.

Figure 2D:
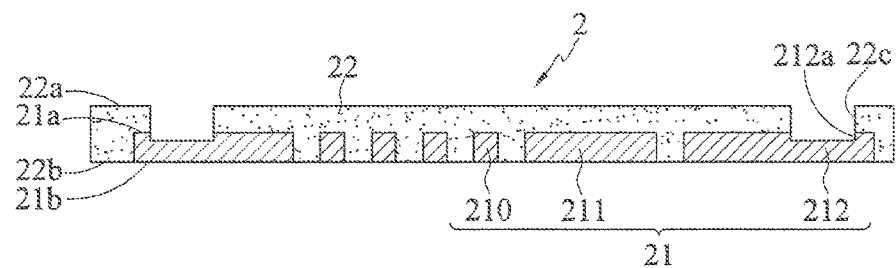

As shown in FIG. 2D, the seed layer 201 is removed by an etching process to expose the second side 22b of the dielectric body 22 and the second surface 21b of the wiring layer 21, so as to obtain the package substrate 2 of the present invention.

In an embodiment, it is also applicable to form a second opening 212a at the same time as the seed layer 201 is removed.

In an embodiment, the second opening 212a is further formed on the electrode regions 212 being exposed from the first opening 22c by an etching process, so as to enhance the bonding between the latter mounted conductive elements and the electrode regions 212 of the wiring layer 21, thereby increasing the reliability of the package substrate 2 of the present invention.

In addition, according to the method of fabricating the package substrate of the present invention, the second opening 212a is formed when the first opening 22c is formed as the first opening 22c is formed by a mechanical drilling or a laser drilling.

Referring to FIG. 2D, the package substrate 2 according to the present invention comprises: a wiring layer 21 having a first surface 21a and an opposing second surface 21b; and an dielectric body 22 having a first side 22a and an opposing second side 22b. The first side 22a has a first opening 22c exposing a portion of the wiring layer 21, and the second surface 21b of the wiring layer 21 is disposed on the same side as the second side 22b of the dielectric body 22.

In an embodiment, the wiring layer 21 is defined with having a plurality of electrical connection regions 210, electrode regions 212 and wiring regions 211, and the second surface 21b of the wiring layer 21 is exposed from the second side 22b of the dielectric body 22. In other words, the electrical connection regions 210, the electrode regions 212 and the wiring regions 211 are exposed from the second side 22b of the dielectric body 22, and the second surface 21b of the wiring layer 21 is coplanar with the second side 22b of the dielectric body 22.

In addition, in the package substrate according to the present invention, only one wiring layer 21 is formed in the dielectric body 22.

FIGS. 3A-3D are schematic views showing a method of fabricating a package structure according to the present invention.

Figure 3A:
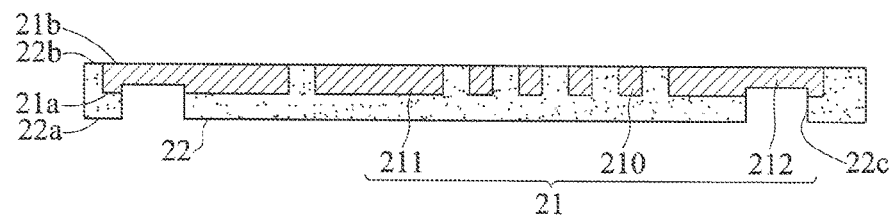
FIGS. 3A-3D are schematic views showing a method of fabricating a package structure according to the present invention, wherein FIG. 3C' shows another embodiment of FIG. 3C.

As shown in FIG. 3A, a dielectric body 22 having an embedded wiring layer 21 is provided. The dielectric body 22 has a first side 22a and an opposing second side 22b, and the first side 22a has a first opening 22c exposing a portion of the wiring layer 21. The wiring layer 21 is defined with having a plurality of electrical connection regions 210 and electrode regions 212. The second side 22b of the dielectric body 22 exposes the electrical connection regions 210 and the electrode regions 212 of the wiring layer 21.

In an embodiment, the wiring layer 21 is defined with having a plurality of electrical connection regions 210, electrode regions 212 and wiring regions 211.

Figure 3B:
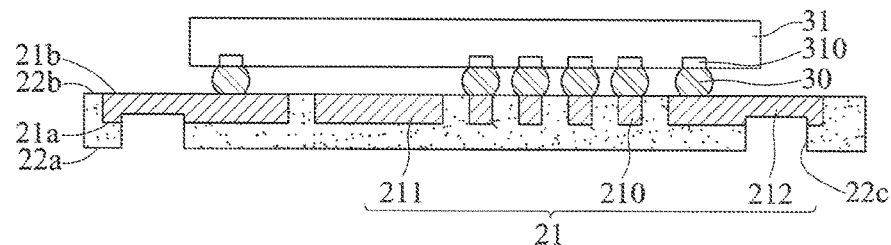

As shown in FIG. 3B, a semiconductor component 31 is disposed on and electrically connected with the wiring layer 21.

In an embodiment, the semiconductor component 31 is electrically connected with the electrical connection regions 210 of the wiring layer 21 via the conductive bumps 30, and the electrode regions 212 are exposed from the first opening 22c of the dielectric body 22. In an embodiment, the semiconductor component 31 has bonding pads 310 electrically connected with the conductive bumps 30.

Figure 3C:
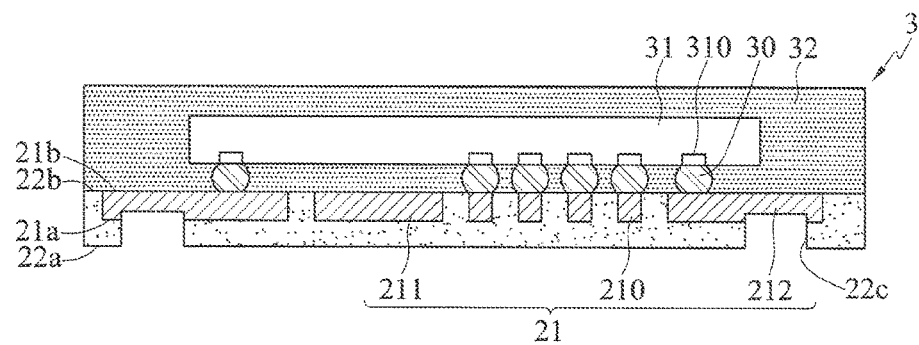
Figure 3C:
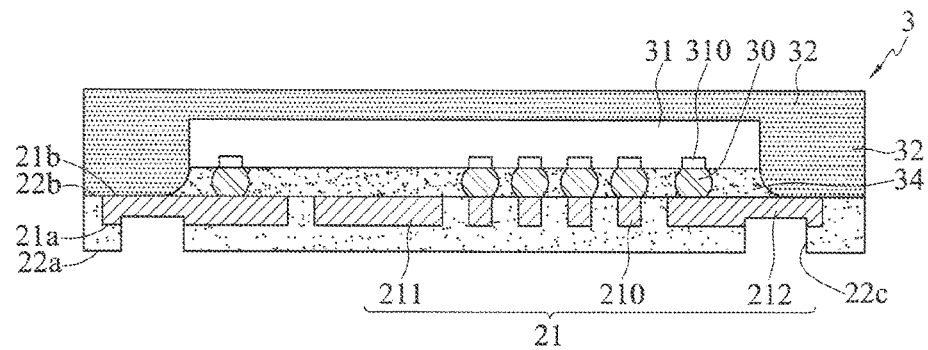

As shown in FIG. 3C, an encapsulant 32 is formed on the dielectric body 22 and encapsulates the semiconductor component 31.

In an embodiment, the encapsulant 32 is formed on the second surface 22b of the dielectric body 22 by a well known method, which will not be described further herein. In an embodiment, an underfill 34 is filled between the semiconductor component and the second side of the dielectric body, as shown in FIG. 3C'.

Figure 3D:
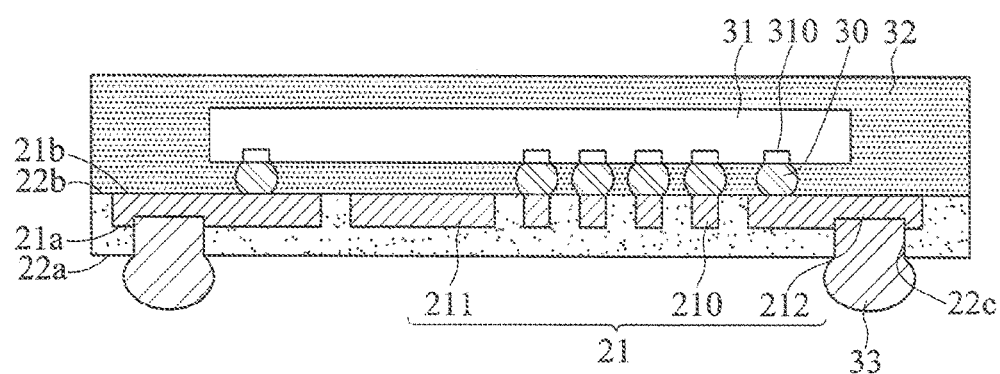

As shown in FIG. 3D, a conductive element 33 is formed in the first opening 22c of the dielectric body 22.

In an embodiment, the package structure further comprises the conductive elements 33 formed in the first opening 22c for electrically connecting with external electrical components. The conductive elements 33 are in direct contact with the electrode regions 212 of the wiring layer 21.

Referring to FIG. 3D, the package structure 3 according to the present invention comprises: a wiring layer 21 having a first surface 21a and an opposing second surface 21b, wherein the second surface 21b of the wiring layer is defined with having a plurality of electrical connection regions 210 and electrode regions 212; an dielectric body 22 formed on the wiring layer 21 and having a first side 22a and an opposing second side 22b, wherein the wiring layer 21 is embedded in the dielectric body 22, the first side 22a of the dielectric body 22 is on the same side as the first surface 21a of the wiring layer, the second side 22b of the dielectric body 22 exposes the second surface 21b of the wiring layer 21, and the first side 22a has a first opening 22c exposing a portion of the wiring layer 21; and a semiconductor component 31, disposed on the second side 22b of the dielectric body 22 and electrically connected with the wiring layer 21.

In an embodiment, the wiring layer 21 is defined with a plurality of electrical connection regions 210, wiring regions 211 and electrode regions 212, and the semiconductor component 31 is electrically connected with the electrical connection regions 210 via the conductive bumps 30, to electrically connect the semiconductor component 31 with the wiring layer 21.

In summary, the package substrate and the package structure including the package substrate according to the present invention are free of a core layer, and the overall thickness of the package substrate and the package structure are effectively reduced. Moreover, as the package substrate according to the present invention has only one wiring layer, conductive vias are not required for electrically connecting the wiring layer at the two opposite sides of the core layer, thereby significantly reducing the overall thickness of the package substrate and the package structure thereof.

In addition, a mechanical drilling or a laser drilling process is not required to form an opening in the dielectric body when the dielectric body is made of a photosensitive dielectric material, such that the overall fabricating process is simplified and the overall production cost is thus reduced.

Furthermore, as the photosensitive dielectric body has both the photo resist and the insulating properties, the need of using a photoresist is omitted, thereby simplifying the overall fabricating process.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a single-layer wiring package substrate, comprising:
   forming a wiring layer having opposing first and second surfaces on a carrier, wherein the second surface of the wiring layer is in contact with the carrier;
   forming a dielectric body on the carrier, wherein the dielectric body has a first side and a second side opposing the first side, and the second side of the dielectric body and the second surface of the wiring layer are disposed at a same side;
   forming a first opening on the first side of the dielectric body with a portion of the wiring layer exposed from the first opening; and
   removing the carrier with the second side of the dielectric body and the second surface of the wiring layer exposed.

2. The method of claim 1, further comprising forming a second opening at the portion of the wiring layer exposed from the first opening, wherein the second opening corresponds in position to the first opening.

3. The method of claim 1, wherein the dielectric body is made of a photosensitive dielectric material.

4. The method of claim 3, wherein the first opening of the dielectric body is formed by an exposure and development process.

5. The method of claim 1, wherein the second side of the dielectric body is coplanar with the second surface of the wiring layer.

6. The method of claim 1, further comprising forming a seed layer on the carrier.

7. The method of claim 6, further comprising:
   removing the seed layer by an etching process; and
   forming a second opening corresponding in position to the first opening by etching the first surface of the wiring layer.

8. A method of fabricating a package structure, comprising:
   providing a dielectric body having a first side with a first opening and a second side opposing the first side, a single wiring layer being embedded in the dielectric body and having a first surface and a second surface opposing the first surface, wherein the second side of the dielectric body and the second surface of the single wiring layer are disposed at a same side, and a portion of the single wiring layer is exposed from the first opening;
   forming on the first surface of the single wiring layer a second opening, wherein the second opening corresponds in position to the first opening; and
   disposing on the second side of the dielectric body a semiconductor component electrically connected with the second surface of the single wiring layer.

9. The method of claim 8, wherein the semiconductor component has a plurality of conductive bumps electrically connected with the second surface of the single wiring layer.

10. The method of claim 8, further comprising forming on the dielectric body an encapsulant encapsulating the semiconductor component.

11. The method of claim 8, further comprising filling an underfill between the semiconductor component and the second side of the dielectric body.

12. The method of claim 8, wherein the dielectric body is made of a photosensitive dielectric material.

13. The method of claim 8, wherein the second side of the dielectric body is coplanar with the second surface of the single wiring layer.

* * * * *